(12) United States Patent
Chayen et al.

(10) Patent No.: US 7,252,713 B2
(45) Date of Patent: Aug. 7, 2007

(54) MESOPOROUS GLASS AS NUCLEANT FOR MACROMOLECULE CRYSTALLISATION

(75) Inventors: Naomi Chayen, London (GB); Larry Hench, London (GB)

(73) Assignee: Imperial Collage Innovations Limited, London (GB)

(*) Notice: Subject to any disclaimer, the term of this patent is extended or adjusted under 35 U.S.C. 154(b) by 2 days.

(21) Appl. No.: 10/534,088

(22) PCT Filed: Nov. 7, 2003

(86) PCT No.: PCT/GB03/04875

§ 371 (c)(1),
(2), (4) Date: Oct. 17, 2005

(87) PCT Pub. No.: WO2004/041847

PCT Pub. Date: May 21, 2004

(65) Prior Publication Data

US 2006/0154042 A1     Jul. 13, 2006

(30) Foreign Application Priority Data

Nov. 7, 2002    (GB) ................................. 0225980.2

(51) Int. Cl.
     *C30B 29/40*      (2006.01)
(52) U.S. Cl. ...................... 117/68; 156/89.11; 423/173; 423/180; 501/2; 501/39; 501/54; 501/63; 623/23.62

(58) Field of Classification Search ................. 117/68; 156/89.11; 423/173, 180; 501/2, 39, 54, 501/63; 623/23.62
See application file for complete search history.

(56) References Cited

U.S. PATENT DOCUMENTS 4,171,544 A    10/1979   Hench et al.

FOREIGN PATENT DOCUMENTS

WO    WO 02/088435      11/2002

OTHER PUBLICATIONS

Blow et al, Protein Science, *Control of Nucleation of Protein Crystals*, vol. 3, 1994, pp. 1638-1643.

(Continued)

*Primary Examiner*—Felisa C. Hiteshew
(74) *Attorney, Agent, or Firm*—Nikolai & Mersereau, P.A.; C. G. Mersereau (57) ABSTRACT

A method of facilitating the crystallisation of a macromolecule comprising the step of adding a mesoporous glass to a crystallisation sample wherein the mesoporous glass comprises pores having diameters between 4 nm and 100 nm and has a surface area of at least 50 $m^2$/g. A method of facilitating the crystallisation of a macromolecule comprising the step of adding to a crystallisation sample a mesoporous glass of the composition $SiO_2$; $CaO$—$P_2O_5$-$SiO_2$ or $Na_2O$-$CaO$—$P_2O_5$-$SiO_2$, wherein each of the Ca, P, Si or Na atoms within the compositions may be substituted with a suitable atom chosen from B, Al, Ti, Mg, or K, and, optionally, the composition may also include heavy elements to enhance X-ray diffraction contrast such as Ag, Au, Cr, Co, Sr, Ba, Pt, Ta or other atom with an atomic number over 20.

27 Claims, 5 Drawing Sheets

OTHER PUBLICATIONS

Chayen et al, J. Appl. Cryst. *An Automated System for Micro-Batch Protein Crystallization and Screening*, vol. 23, 1990, pp. 297-302.

Chayen et al, Journal of Crystal Growth, *Microbatch Crystallization Under Oil—A New Technique Allowing Many Small-volume Crystallization Trials*, vol. 122, 1992, pp. 176-180.

Chayen et al, Journal of Crystal Growth, *Is Lysozyme Really the Ideal Model Protein?*, vol. 232, 2001, pp. 262-264.

Chayen et al, Protein Science, *Control of Nucleation in the Crystallization of Lysozyme*, vol. 2, 1993, pp. 113-118.

Coleman & Hench, Ceramics International, *A Gel-derived mesoporous Silica Reference Material for Surface Analysis by Gas Sorption*, vol. 26, 2000, pp. 171-178.

Cook et al, Key Engineering Materials, *Pore Characterisation and Interconnectivity Studies on bioactive 58 S Sol-Gel Glass*, vols. 192-195, 2001, pp. 625-628.

D'Arcy et al, Journal of Crystal Growth, *A Novel Approach to Crystallising Proteins Under Oil*, vol. 168, 1996, pp. 175-180.

Dusastre, Nature, *Pore Characterization*, vol. 408, 2000, pp. 417.

Feher & Kam, Methods Enzymology, *Nucleation and Growth of Protein Crystals: General Principles and Assays*, vol. 114, 1985, pp. 77-112.

Hench & West, Life Chemistry Reports, *Biological Applications of Bioactive Glasses*, vol. 13, 1996, pp. 187-241.

Hench, Current Opinion in Solid State & Materials Science, *Sol-gel Materials for Bioceramic Applications*, vol. 2, 1997, pp. 604-610.

Hench & West, Chem. Rev., *The Sol-Gel Process*, vol. 90, 1990, pp. 33-72.

http://proteome.bn1.gov/progress.html, *Progress toward structure solution by X-ray Crystallography*, Jan. 18, 2005, pp. 1-3.

Lenza et al, Journal of Materials Science: Materials in Medicin, *Surface-modified 3D Scaffolds for Tissue Engineering*, vol. 13, 2002, pp. 837-842.

Li et al, Journal of Applied Biomaterials, *An Investigation of Bioactive Glass Powders by Sol-Gel Processing*, vol. 2, 1991, pp. 231-239.

Li et al, Chemical Processing of Advanced Materials, *Effects of Structure and surface Area on bioactive Powders by Sol-Gel Process*, vol. 56, 1992, pp. 627-633.

Malkin et al, Journal of Crystal Growth, *Crystallization of Stellite tobacco Mosaic Virus I. Nucleation Phenomena*, vol. 126, 1993, pp. 544-554.

McPherson and Schlichta, *Heterogeneous and Epitaxial Nucleation of Protein Crystals on Mineral Surfaces*, vol. 239, 1988, pp. 385-387.

Orefice et al, Journal of Biomedical Material Research, *Novel Sol-Gel Bioactive Fibers*, vol. 55, 2001, pp. 460-467.

Pereira & Hench, Journal of Sol-Gel Science and Technology, *Mechanisms of Hydroxyapatite Formation on Porous Gel-Silica Substrates*, vol. 7, 1996, pp. 59-68.

Roether et al, BIOMATERIALS, *Development and in vitro Characterization of Novel Bioresorbable and Bioactive Composite Materials Based on Polylactide Foams and Bioglass for Tissue Engineering Applications*, vol. 23, 2002, pp. 3871-3878.

Rosenberger et al, Journal of Crystal Growth, *Temperature Dependence of Protein Solubility—Determination and Application to Crystallization in X-ray Capillaries*, vol. 129, 1993, pp. 1-12.

Sanjoh et al, Journal of Crystal Growth, *Spatiotemporal Protein Crystal Growth Studies Using Microfluidic Silicon Devices*, vol. 196, 1999, pp. 691-702.

Sanjoh et al. Journal of Crystal Growth, *Surface-potential Controlled Si-microarray Devices for Heterogeneous Protein Crystallization Screening*, vol. 232, 2001, pp. 618-628.

Saravanapavan and Hench, Journal of Biomedical Material Research, *Low-Temperature synthesis, Structure, and Bioactivity of Gel-Derived Glasses in the Binary $CaO$-$SiO_2$ System*, vol. 54, 2001, pp. 608-618.

Sepulveda et al, Journal of Biomedical Material Research, *Bioactive Sol-Gel Foams for Tissue Repair*, vol. 59, 2002, pp. 340-348.

Sing et al, Pure and Appl. Chem., *Reporting Physisorption Data for Gas/Solid Systems*, vol. 57, 1985, pp. 603-619.

Stamboulis et al, Advanced Engineering Materials, *Novel Biodegradable Polymer/Bioactive Glass Composites for Tissue Engineering Applications*, vol. 4, No. 3, 2002, pp. 105-109.

Stura, Protein Crystallization: Techniques, Strategies and Tips, (ed. Bergfors, T.M.) (International University Line, LaJolla; 1999).

Visuri et al, Bio/Technology, *A New Method for Protein Crystallization Using High Pressure*, vol. 8, 1990, pp. 547-549.

Chayen et al, Acta Cryst., *Protein crystallization for Genomics: towards High-throughput Optimization Techniques*, vol. 58, 2002, pp. 921-927.

Chayen et al, Journal of Molecular Biology, *Porous Silicon: An Effective Nucleation-inducing Material for Protein Crystallization*, vol. 312, 2001, pp. 591-595.

Sakamoto et al, Nature, *Direct Imaging of the Pores and Cages of Three-Dimensional Mesoporous Materials*, vol. 408, 2000, pp. 449-453.

Saridakis et al, Acta Cryst, *Separating Nucleation and Growth in Protein Crystallization Using Dynamic Light Scattering*, vol. 58, 2002, pp. 1597-1600.

Wiencek, Annu. Rev. Biomed. Eng., *New Strategies for Protein Crystal Growth*, vol. 1, 1999, pp. 505-534.

Fabbri et al, BIOMATERIALS, *Hydroxyapatite-based Porous Aggregates: Physico-Chemical Nature, Structure, Texture and Architecture*, vol. 16, 1995, pp. 225-228.

Drenth, J. (1994), Principles of Protein X-Ray Crystallography, Springer-Verlag, New York (Textbook, copy not provided).

Hench, L. L. (1998), Sol-Gel Silicas, Hayes Publishing Co., New York (Textbook, copy not provided).

Iler, R. K. (1979), The Chemistry of Silica, J Wiley & Sons, New York (Textbook, copy not provided).

Lowell S., Shields JE. (1984) Powder Surface Area and Porosity. Chapman and Hall (Textbook, copy not provided).

(b) # pores of diameter d

MESOPOROUS GLASS AS NUCLEANT FOR MACROMOLECULE CRYSTALLISATION

This application is a 371 of PCT/GB03/004875, filed 07 Nov. 2003.

The present invention relates to the use of a novel nucleant in the crystallisation of macromolecules, and methods of crystallising macromolecules, such as proteins using the novel nucleant.

To date, nucleation of crystals has been facilitated mainly by seeding, epitaxy, charged surfaces or mechanical means (Stura, E. A. In *Protein crystallization: techniques, strategies, and tips.* (ed Bergfors, T. M.) (International University Line, La Jolla; 1999); McPherson, A. & Shlichta, P. *Science* 239, 385-387 (1988); Sanjoh, A. & Tsukihara, T. *J. Cryst. Growth* 196, 691-702 (1999); Sanjoh, A., Tsukihara, T. and Gorti, S. *J. Crystal Growth* 232 618-628 (2001); Visuri, K. et al. *Bio/Technology* 8, 547-549 (1990)). Nucleation of crystals the necessary first step in the crystallisation process, which influences it decisively. Consequently, the ability to control it is of primary importance in crystallisation experiments. Nucleation presents a free energy barrier which must be overcome in a specific way, different from the supersaturation conditions which subsequently make crystal growth an energetically favourable process (Feher, G. & Kam, Z. *Methods Enzymol.* 114, 77-112 (1985)). Formation of nuclei in the bulk of a solution is a stochastic process where protein molecules interact until a critical size aggregate is formed. Any environment that favours a higher local concentration of macromolecules provides a potential nucleation point and may lower the energy barrier for nucleation.

Pilot structural genomics projects show the success rate of getting from clone to structure to be about 10%. Production of crystals suitable for X-ray crystallography is found to be the rate-limiting step (e.g. the Human Proteome Structural Genomics pilot project; Brookhaven National Laboratory, The Rockefeller University and Albert Einstein College of Medicine: http://proteome.bnl.gov/progress.html). It is currently crucial to find methods that will help to overcome this stumbling block.

The ultimate aim would be to find a 'universal' nucleant, which would promote crystallisation of a very wide range of proteins under a very wide range of conditions. Previous studies attempting to find nucleants have been undertaken by introducing candidate substances into crystallisation trials in a controlled manner (McPherson and Schlichta *Science* 239, 385-387 (1988); Chayen, N. E., Radcliffe, J. W. & Blow, D. M. *Protein Sci.* 2, 113-118 (1993); Blow, D. M., Chayen, N. E., Lloyd, L. F. & Saridakis, E. *Protein Sci.* 3, 1638-1643 (1994); Malkin, A. J., Cheung, J and McPherson, A. (1993) *J. Crystal Growth* 126 544-554 (concerning "Mcpherson Beads"—latex beads)). Some have been useful for individual proteins but none is have yet turned out to be of general use. Various other attempts to induce nucleation on irregular or rough surfaces, or surfaces of special composition (poly-L-lysine, plastic) have also proved generally ineffective (Chayen, N. E. & Saridakis, E. *J. Cryst. Growth* 232, 262-264 (2001).

Sakamoto et al. *Nature* 408, 449-453 (2000) and Dusastre *Nature* 408:417 (2000) describe methods of characterising mesoporous materials and report the structures of some mesoporous materials. They are suggested to be useful in various areas of chemistry such as catalysis and molecular filtration but their use in crystal nucleation is not suggested.

We have found that mesoporous glasses with particular characteristics are useful as crystallisation nucleants. The mesoporous glasses are considered to have pores which may entrap macromolecules, for example protein molecules, and encourage them to nucleate and form crystals.

A first aspect of the invention provides a method of facilitating the crystallisation of a macromolecule comprising the step of adding a mesoporous glass to a crystallisation sample wherein the mesoporous glass comprises pores having diameters between 4 nm and 100 nm and has a surface area of at least 50 m$^2$/g.

In particular embodiments, the mesoporous glass comprises pores having diameters between 4 nm and 70 or 80 nm, 4 nm and 40 nm or 7 and 40 nm. In the embodiment described in Example 2 in which the mesoporous glass has pores having diameters between 7 and 40 nm, the modal pore size is 11.2 nm and the mean pore size is 16 nm.

Pore size distributions are calculated using the standard technique in the field, ie from gas (for example N$_2$ or He) adsorption and desorption isotherm data using the BJH method (Barrett E P, Joyney L G, Halenda P P. *J of Am. Chem. Soc.* 1951; 73: 373-380), as described in Examples 1 and 2. Using such a method, less than 10%, 5% or 2% of the pores (by number) fall outside the specified size range, for example the range of 4 nm to 100 nm. The pore size may show a broad Gaussian distribution across the stated range. A range of pore sizes is considered to be provide good nucleation properties; a narrow pore size distribution, for example in which more than 80, 85 or 90% of the pores have a pore size within the range of Xnm and (X+10 nm) or (X+5 nm), in which X lies within the specified size range, is considered not to provide such good nucleation properties.

When used herein the term 'mesoporous glass' includes a glass with unordered, irregularly sized pores whose diameters can range from a few nanometers to tens or hundreds of nanometers. The glass may be a fusion of one or more oxides of silicon, boron, and phosphorous, with one or more oxides of sodium, magnesium, calcium or potassium, and optionally sodium or calcium carbonate. Alternatively and preferably the mesoporous glass with unordered, irregularly sized pores whose diameter can range from a few nanometers to tens or hundreds of nanometers can be made by creating a gel from alkoxide precursors of SiO$_2$, such as tetramethylorthosilicate (TMOS) or tetraethylorthosilicate (TEOS) hydrolysed with H$_2$O and a catalyst (such as HNO$_3$ or HF) to make a mesoporous silica (SiO$_2$) glass or hydrolysed with H$_2$O and a catalyst in combination with alkoxide precursors of P$_2$O$_5$, such as triethoxylorthophosphate (TEP, OP(OC$_2$H$_5$)$_3$), or nitrate precursors of CaO, such as Ca(NO$_3$)$_2$, or precursors of Na$_2$O, such as sodium citrate. Examples include SiO$_2$, CaO—P$_2$O$_5$—SiO$_2$ or Na$_2$O—CaO—P$_2$O$_5$—SiO$_2$. The mesopores in the sol-gel-derived glass arise when the three dimensional network is establishing during gelation and are retained following controlled drying, a technique well known to those skilled in the art and described in Hench (1997) *Curr Opin Solid State Mater Science* 2, 604-610, Li et al (1991) *J Appl Biomaterials* 2, 231-239, Hench and West (1990) *Chem Rev* 90, 33-72.

The pores of the mesoporous glass useful in the present invention have diameters of between 4 nm and 100 nm (or, in embodiments, other ranges, as noted above), as determined using a standard gas sorption analysis method such as described in Coleman & Hench (2000) A gel-derived mesoporous silica reference material for surface analysis by gas sorption. 1: Textural features *Ceramics International* 26, 171-178. For example, the pore sizes may be calculated from standard gas (for example N$_2$) desorption data using the BJH method (see Example 2 and [5]). The mesoporous glass may have a heterogeneous population of pore sizes. The material may have open-ended cylindrical pores, as determined from gas (for example $N_2$) adsorption/desorption isotherms, as known to those skilled in the art and as described in Example 2. The hysteresis loop may be of type H1 (Sing K S W, Everett D H, Haul R A W. *Pure and Appl. Chem.* 1985; 57: 603-619), which indicates that the material contains primarily open-ended and interconnected cylindrical pores which are not closed at the surface.

The mesoporous glass of use in the method of the invention may have a surface area of at least 250 $m^2/g$, 200 $m^2/g$, 150 $m^2/g$, 100 $m^2/g$, or at least 50 $m^2/g$. The surface area is preferably less than 300 $m^2/g$. In an embodiment, the surface area is between 150 $m^2/g$ and 100 $m^2/g$. The surface area of the mesoporous glass is a measure of both the pore size and the number of pores, and can be increased or decreased during the sol-gel process, as will be appreciated by those skilled in the art, and as described in Hench, L. L. (1998) Sol-Gel Silicas, Hayes Publishing Co, New York, and in Iler, R. K. (1979) The Chemistry of Silica, J Wiley & Sons, New York. The surface area of the mesoporous glass can be calculated using a gas (for example $N_2$) sorption isotherm as described further in Example 2, or any other equivalent surface analysis methods.

Mesoporous glasses that may be of particular use in the method of the invention are described in Example 1 and in Cook et al (2000) *Bioceramics*, 13, 625-628; Sepulveda et al (2002) *J Biomed Mater Res.* 59, 340-8; Pereira & Hench (1996) *J Sol-gel Sci Tech* 7, 59-68; Li et al (1992) *Chem Proc Adv Mater* 56, 627-633; Lenza et al (2002) *J Mater Sci, Mat in Med* 13, 837-892; Orefice et al (2001) *J Biomed Mater Res* 55, 460-467.

It will be understood that where the term "macromolecule" is used, we include any molecule over 1 kDa. Preferably the macromolecule is a biological macromolecule such as a nucleic acid, and more preferably the macromolecule is a polypeptide. Preferably the polypeptide comprises at least 10, 20 or 50 amino acids, more preferably at least 75, 100, 200, 500 or 1000 amino acids.

A second aspect of the invention provides a method of facilitating the crystallisation of a macromolecule comprising the step of adding to a crystallisation sample a mesoporous glass of the composition $SiO_2$, $CaO$—$P_2O_5$—$SiO_2$ or $Na_2O$—$CaO$—$P_2O_5$—$SiO_2$, wherein each of the Ca, P, Si or Na atoms within the compositions may be substituted with a suitable atom chosen from B, Al, Ti, Mg, or K, and, optionally, the composition may also include heavy elements to enhance X-ray diffraction contrast such as Ag, Au, Cr, Co, Sr, Ba, Pt, Ta or other atom with an atomic number over 20.

In a preferred embodiment of the second aspect of the invention the mesoporous glass is of the composition $SiO_2$, $CaO$—$P_2O_5$—$SiO_2$ or $Na_2O$—$CaO$—$P_2O_5$—$SiO_2$.

$CaO$—$P_2O_5$—$SiO_2$ and $Na_2O$—$CaO$—$P_2O_5$—$SiO_2$ are bioactive mesoporous glasses which have been proposed to be useful in regenerating bone (Saravanapavan and Hench (2001) *J Biomed Mater Res.* 54, 608-18; Sepulveda et al (2002) *J Biomed Mater Res.* 59, 340-8 Cook et al (2000) *Bioceramics*, 13, 625-628) The $Na_2O$—$CaO$—$P_2O_5$—$SiO_2$ composition is also bioactive and described in detail in Hench & West (1996) *Life Chem Prep* 13, 187-241. The bioactive bone-bonding response of mesoporous $SiO_2$ glass has been described by Hench & Walker (1979) in U.S. Pat. No. 4,171,544.

Example 1 demonstrates the suitability of mesoporous glasses as a nucleant to facilitate the crystallisation of macromolecules By 'substituted with a suitable atom' we mean that the atom chosen from the selection offered is of a same valency to that of the substituted atom, eg Mg for Ca, K for Na; alternatively atoms of multiple valence, such as P, can be substituted for Si in the glass networks.

It is preferred that the mesoporous glass of use in the second aspect of the invention comprises pores having diameters between 200 nm, 150 nm or 100 nm and 2, 4, 7, 10, or 20 nm. Still more preferably, the pore diameters and distribution thereof are as indicated above in relation to the first aspect of the invention. Thus, in embodiments of the second aspect of the invention the mesoporous glass of use in the method comprises pores having diameters of between 4 nm and 100 nm or 7 nm and 40 nm, as measured using standard methods, for example as described in Example 2.

In relation to the first or second aspect of the invention the distribution of pore dimensions of the mesporous glass of use in a method of the invention has a standard deviation of at least 5 nm, 10 nm or 15 nm.

Typically, the mesoporous glass which is of use in the second aspect of the invention is distinguished by the non-uniform distribution of the pore sizes within it. Hence, it is preferred if the pores in the mesoporous glass are not uniform in size, and have a high variability in the pore size.

In a further embodiment of the methods of the invention the mesoporous glass has interconnected pores. For example, the pores may include open-ended cylindrical pores, as described in Example 2.

When used herein the term 'interconnected pores' includes a mesoporous glass wherein at least some of the pores are interconnected so that the contents of one pore or cavity are accessible to one or more adjacent or connected pores or cavities and intersect as open pores with the surface.

Typically, the interconnected nature of the pores is shared by at least 5%, 10%, 20%, 30%, 40%, 50%, 60% or 70% of the pores of the mesoporous glass. Preferably, the mesoporous glass has a H1 classification of pores as described by Sing et al (1985) *Pure and Appl Chem* 57, 603-619, ie the mesoporous glass contains primarily open-ended cylindrical pores that are interconnected.

The porosity of $CaO$—$P_2O_5$—$SiO_2$ and $Na_2O$—$CaO$—$P_2O_5$—$SiO_2$ can be varied using a foaming technique. For example, nonfoamed $CaO$—$P_2O_5$—$SiO_2$ has a surface area of 146.4 $m^2/g$ whereas low foamed $CaO$—$P_2O_5$—$SiO_2$ has a surface area of 239.6 $m^2/g$ (Sepulveda et al (2002) *J Biomed Mater Res.* 59, 340-8). Foaming also alters the average pore size and the 3-D nature of the pores and induces very large pores of 100 μm or greater in addition to the mesopores. Therefore, mesoporous glass of the composition $CaO$—$P_2O_5$—$SiO_2$ or $Na_2O$—$CaO$—$P_2O_5$—$SiO_2$ may be made using the techniques described in Sepulveda et al (2002) *J Biomed Mater Res.* 59, 340-8 or as described in Pereira & Hench (1996) *J Sol-Gel Sci and Tech* 7, 59-68 or Li et al (1992) *Chem Proc Adv Mater* 56, 627-633, to generate a porous substance having a surface area suitable for use in the invention, with an average pore size dimension suitable for use in the invention, and a variability in the average pore size dimensions and having interconnected pores suitable for use in the invention.

Materials such as Sephadex™ beads, alumina powders and zeolites have been tried previously in the crystallisation of macromolecules and were found to be ineffective as general-use nucleants (Chayen, N. E. & Saridakis, E. *J. Cryst. Growth* 232, 262-264 (2001)). Sephadex™ comprises a meshwork produced by cross-linking of the substituent material. This meshwork effectively creates pores, the size of which are determined by the degree or type of cross-linking. It will be appreciated that Sephadex™ and sand are not included in the present definition of "mesoporous glass". A difference between the porous material useful in the present invention and Sephadex™ is that that the pores in each given type of Sephadex bead are of quasi-uniform size. As described above, the mesoporous glass useful in the present invention comprises pores of variable sizes as defined above; the material has an average pore diameter generated by a fairly wide Gaussian-type spread of pore size. Hence the spread of pore dimension in the porous material is wider than that of cross-linked dextrans.

It will be appreciated that a convenient average pore size for a particular application may depend on the size of the macromolecule to be crystallised. For example, larger macromolecular assemblies (ie with a size larger than 5 nm or 10 nm or 15 nm Stokes' radius) such as virus capsids etc. may require bigger pores (ie, pores with an average size larger than 10 nm or 20 nm or 50 nm in any one plane) than the pore size required by smaller macromolecular assemblies, such as those with a Stokes' radius of 5 nm or less.

In a preferred embodiment of the methods of the invention, crystallisation of the macromolecule is induced at a lower critical level of super saturation than that obtained where the mesoporous glass is not added to the sample.

In a further or alternative preferred embodiment, the conditions of the crystallisation sample is one which comprises conditions of supersaturation that are favourable to the crystal growth, but are inadequate or insufficient for spontaneous nucleation. Such conditions are a means to maximise the chances of obtaining crystals during initial screening of crystallisation conditions, and provide a means of growing crystals at metastable conditions, at which the slower growth and the lack of excess and secondary nucleation often provide for growth of larger, better diffracting crystals.

Determination of which supersaturation level is inadequate or insufficient for spontaneous nucleation is well known in the art of crystallisation. The level of supersaturation can be determined by setting-up screens covering a range of conditions around the conditions that yield crystals/microcrystals spontaneously.

A third aspect of the invention provides for a method of preparing a mesoporous glass as defined in relation to the first or second aspects of the invention for use as a nucleant in crystallisation comprising fracturing said material into pieces of sub-millimetre dimensions.

The mesoporous glass in relation to the third aspect of the invention may be prepared de novo in pieces of sub-millimetre dimensions by formation of the gel network whilst undergoing agitation.

Preferably, the mesoporous glass is converted into pieces or fragments which are no more than 200 μm, 150 μm or 100 micron in any dimension, more preferably no more than 75 μm or 50 μm, and still more preferably no more than 25 μm in any dimension. More preferably the pieces are no more than 10 micron in any dimension. Advantageously, the pieces of mesoporous glass resemble a fine dust. Conversion of a mesoporous glass into fragments may be achieved by using a diamond or SiC cutter.

By "fracture" we mean that the starting material is rendered into smaller fragments or pieces. Fracture may be by any suitable technique, including cutting with a scalpel or by mechanical means (such as using a diamond cutter) or by breaking smaller pieces off the larger one using tweezers. Typically, the mesoporous glass useful in the present invention cannot be broken by hand in small enough pieces. The surface is mechanically fragile, so grinding or crushing under low loads (for example with vibration) is preferred. It will be appreciated that to be useful as a nucleant in crystallisation, the fragments or pieces should be such that the network of pores within the mesoporous glass is exposed. In other words, the pores should be accessible by suitably sized molecules (ie, those which are not bigger than the size of the pores) when contacted by said molecules. Hence, fragments or pieces of the mesoporous glass are not sealed externally in any way by the fracture process.

The fracture method may be manual (as described above), or may be mechanical or one which employs a motorised machine.

A fourth aspect of the invention is a method of determining the structure of a macromolecule comprising the steps of (i) crystallising the macromolecule in the presence of a mesoporous glass as defined in relation to the first or second aspects of the invention, and (ii) analysing the crystal structure of the crystal produced in step (i).

The porous materials which are useful and/or preferred in the fourth aspect of the invention are those as defined in more detail above. Preferably, the porous material is produced by the method of the third aspect of the invention. The material may be combined with the crystallisation sample components in any order. Preferably, the material is added before nucleation or growth of the crystallisation has started.

Nucleation may be detected by any suitable means; either directly, for example by using a microscope, or indirectly, for example by determining the light scatter characteristics as described in Rosenberger et al *J. Cryst. Growth* 129:1-12 (1993); Saridakis et al *Acta Cryst D* 58, 1597-1600 (2002).

Methods of analysing the crystal structure of a crystal are well known in the art and are described in detail in (Drenth, J. *Principles of protein X-ray crystallography*. Springer-Verlag, New-York, 1994).

A fifth aspect of the invention is a chamber suitable for crystallising a macromolecule wherein said chamber comprises (at least in part) a mesoporous glass as defined in relation to the first or second aspect of the invention. The chamber may be formed from the mesoporous glass (at least in part; for example in the form of an insert) or the mesoporous glass may form a coating on the chamber (ie on a portion of the chamber not formed from the mesoporous glass). It will be appreciated that the mesoporous glass is in a portion of the chamber that is in contact with the crystallisation sample, at least at the start of the crystallisation trial.

By 'a chamber suitable for crystallisation' we include a chamber in a crystallisation plate or multi-well plate, or an individual chamber, as will be well known to those skilled in the art. For example, the "cover slip" from which a drop is suspended in "hanging drop" crystallisation (or on which a drop may sit in a "sitting drop" crystallisation) may be formed from or coated with the mesoporous glass.

The chambers can be made or coated with the mesoporous glass by use of a process similar to that described in Roethen et al (2002) *Biomaterials* 23, 3871-3878. The coating may be a continuous coating or may be a coating of particles of the mesoporous glass.

A further aspect of the invention provides a fibre, mesh or film comprising a mesoporous glass as defined in relation to the first or second aspect of the invention. A further aspect of the invention provides the use of such a fibre, mesh or film as a crystallisation nucleant, for example in a method of the invention. The fibre may be a fibre formed from a different material which is coated with the mesoporous glass (either as a continuous layer or as particles of the mesoporous glass). Crystals grow on the fibre, which may slowly be pulled through the solution and thus enable continuous growth. Thus, the fibre-form nucleant is capable of being used in a continuous process.

Coating may be performed using, for example, a method similar to, but not limited to, that described by Stamboulin et al (2002) *Adv Eng Met* 105-109 and Roether et al (2002) *Biomaterials* 23, 3871-3878.

A sixth aspect of the invention provides a use of a mesoporous glass as defined in relation to the first or second aspects of the invention or a chamber as defined in the fifth aspect of the invention in the crystallisation of a macromolecule.

Preferred macromolecules and suitable and preferred mesoporous glasses are described above.

Mesoporous glasses as defined in relation to the first or second aspects of the invention have not previously been contemplated as nucleants in macromolecule crystallisation. Their usefulness in nucleation may be due to the ability of the macromolecules to be crystallised to encounter a pore of a suitable size, be retained by the pores, and as a result be joined by other similar molecules. The retention of the macromolecules in a pore forms a local concentration suitable for nucleation.

A seventh aspect of the invention provides a kit of parts comprising a crystallisation agent and a mesoporous glass as defined in relation to the first or second aspects of the invention or a chamber as defined in the sixth aspect of the invention.

Storage of the mesoporous glass nucleant should preferably be in the presence of a standard indicating dessicant powder.

By "crystallisation agent" we include any one or more of a range of precipitants such as polymers and organic solvents and crystallisation agents such as salts. Specific examples of suitable precipitants include polyethylene glycol 400, polyethylene glycol 4000, mono-sodium dihydrogen phosphate and ammonium sulphate.

It will be appreciated that the kits of the invention are suitable for all crystallisation methods, including the microbatch, vapour diffusion hanging drop, sitting drop, sandwich drop and the free interface diffusion crystallisation methods. It would also be applicable to insert the glass nucleant into gelled drops.

The kits of the invention may further comprise crystallisation plates or slides and/or filters or crystallisation chambers. Where the kit further comprises crystallisation plates, it is preferred if the plates are multi-well plates, which would be particularly suitable for a high throughput screening system.

In a preferred embodiment of this aspect, the kit further comprises oil for layering over the crystallisation sample. Suitable oils include paraffin such as that available from Hampton Research, Calif. 92677-3913 USA, catalogue number HR3-411.

In an alternative embodiment, the kit may be one which is suitable for screening for the crystallisation of macromolecules. In this embodiment, the kit may further include any one or more of a range of buffers (which may cover a range of pH values) and/or any one or more of a range of salts. Suitable buffers and salts are known in the art of crystallisation and include Na-HEPES pH 7.5, Tris hydrochloride pH 8.5 as buffers, and 0.2M ammonium sulphate and 0.2M sodium acetate trihydrate as salts. Advantageously, the kit may further comprise multi-well crystallisation plates and filters.

An eighth aspect of the invention provides an automated method of crystallising a macromolecule comprising adding a mesoporous glass as defined in relation to the first or second aspects of the invention to a crystallisation trial using an automated dispensing system.

Suitable and preferred mesoporous glasses are as described above.

Advantageously, the crystallisation is part of a screen or optimisation for crystallisation conditions.

The mesoporous glass may be prepared for administration to the trial by any suitable means. Preferably, the mesoporous glass is in the form of fine fragments, of no more than 10 micron in any dimension. In a preferred embodiment, the mesoporous glass is prepared according to the third aspect of the invention.

It will be appreciated that the mesoporous glass may be added as a single grain or particle or piece, or it may be added as a suspension in a liquid. Ensuring that only a single particle which may be only 10 micron in size is dispensed into an automated trial may be awkward, or may involve an unacceptably high level of error, such that no particle, or too many particles are added. Clearly then, an advantage of the method where the mesoporous glass is added as a suspension is the ability to manipulate the mesoporous glass more easily, especially automatically using an automated liquid dispensing system. Forming a suspension of the mesoporous glass particles in a liquid such that dispensing a particular volume of the liquid is likely to include at least 1 piece or fragment of the mesoporous glass, but not too many pieces or fragments, would facilitate the step of adding the fragment to a crystallisation sample.

Hence, in a preferred embodiment of this aspect of the invention, the mesoporous glass is dispensed by an automated liquid dispensing system as a suspension.

Automated liquid dispensing systems are known in the art of protein crystallisation, and an example is the IMPAX system produced by Douglas Instruments, Hungerford, UK. In this system, several components of the crystallisation sample can be dispensed from separate reservoirs through the same tip into a single sample drop. Suitably, the automated system useful in this aspect of the invention is programmable such that defined volumes and concentrations of liquid or suspension may be dispensed into the crystallisation drop.

The crystallisation trial may be any suitable method, including microbatch (Chayen et al (1990) *Appl. Cryst.* 23:297; Chayen et al (1992) *J. Crystal Growth* 122:176) and vapour diffusion. The microbatch method may be modified as described in D'Arcy et al (1996) *J. Crystal Growth* 168:175-180 to use a mixture of silicon and paraffin oil over the crystallisation sample. To maintain the level of supersaturation which is suited to crystal growth, and which does not promote nucleation, it is preferred if the oil used is one which does not permit detectable diffusion of water molecules to the oil-air interface, and therefore one which does not promote a concentration of the components of the crystallisation sample. Hence it is preferred if the oil is a branched paraffin in the C20+ range, and not a silicon fluid (such as a polymer of dimethylsiloxane units).

An ninth aspect of the invention provides a crystal obtainable or obtained by the method of the first, second or eighth aspects of the invention.

As described above, it is likely that use of the mesoporous glass in the crystallisation material causes the macromolecule to be crystallised to nucleate within the pore network of the material, and not on the surface of the mesoporous glass. Consequently, the resulting crystal may include the mesoporous glass within the actual crystal structure of the crystal produced. Such crystals may be distinct from crystals obtained by alternative means (such as using a mineral surface to promote nucleation), since the nucleant may form an integral part of the crystal, and not a peripheral part.

A further aspect of the invention provides a use for an automated liquid dispensing system in the method of the eighth aspect of the invention, wherein the mesoporous glass to be dispensed is in the form of a suspension.

A "automated liquid dispensing system" includes any suitable automated dispensing system capable of dispensing a volume of a suspension of the porous material which is between 2 nl and 1 ml, for example between 2 nl and 50 or 20 nl, for example 5 nl or 10 nl (for low volume/high throughput trials) or between 0.05 or 0.1 µl and 1 ml (for larger volume trials). Preferably the system is one as described above.

The fibre, mesh or film of the invention may also be used in an automated system.

The invention will now be described in more detail with the aid of the following, non-limiting Figures and Examples.

Documents referred to herein are hereby incorporated by reference.

EXAMPLE 1

A method of Crystallising Crustacyanin Using $CaO-P_2O_5-SiO_2$ Mesoporous Glass as a Nucleant The materials tested as nucleants were bioactive CaO—P2O5—SiO2 gel-glass particles. One (58S) has a distribution of pores as described in Example 2 and the other does not have detectable pores (45S5; control), as described in Example 2.

The $CaO-P_2O_5-SiO_2$ (58S) mesoporous glass nucleant was prepared by hydrolysing teraethylorthosilicate (TEOS) with $H_2O$ in the presence of $HNO_3$ as a catalyst. The precursor of the $P_2O_5$ was triethoxylorthophosphate (TEP) and the CaO precursor was $Ca(NO_3)_2.4H_2O$. The gel was dried at 60° C. and 130° C. and stabilised at 100° C. to remove water from the pores and pore surfaces.

The bioactive 45S5 glass was prepared by melting $SiO_2$, $P_2O_5$, $CaCO_3$ and $Na_2CO_3$ in a Platinum crucible at 1350° C. and quenching the molten glass into water to form a frit follwed by crushing to form the non-porous particles.

The protein used (alpha crustalcyanin) tends to produce showers of crystals overnight which are disordered. It was tested whether, if using the glass nucleants, large single crystals would be obtained under conditions of lower supersaturation, which would otherwise produce clear drops.

Two sets of Control drops were set up:
(1) At supersaturated conditions which give the showers of crystals.
(2) At lower supersaturation conditions (i.e. lower precipitant concentration or what is termed as metastable conditions).

Other drops from the same protein preparation were set up at the same conditions as (2) but one set of drops contained the $CaO-P_2O_5-SiO_2$ mesoporous glass (1 or 2 grains added to the drop), while another set of drops had non porous glass grains added to the drops.

Control (1) gave showers of crystals overnight as expected.

Control (2) remained clear indefinitely

Figure 1:
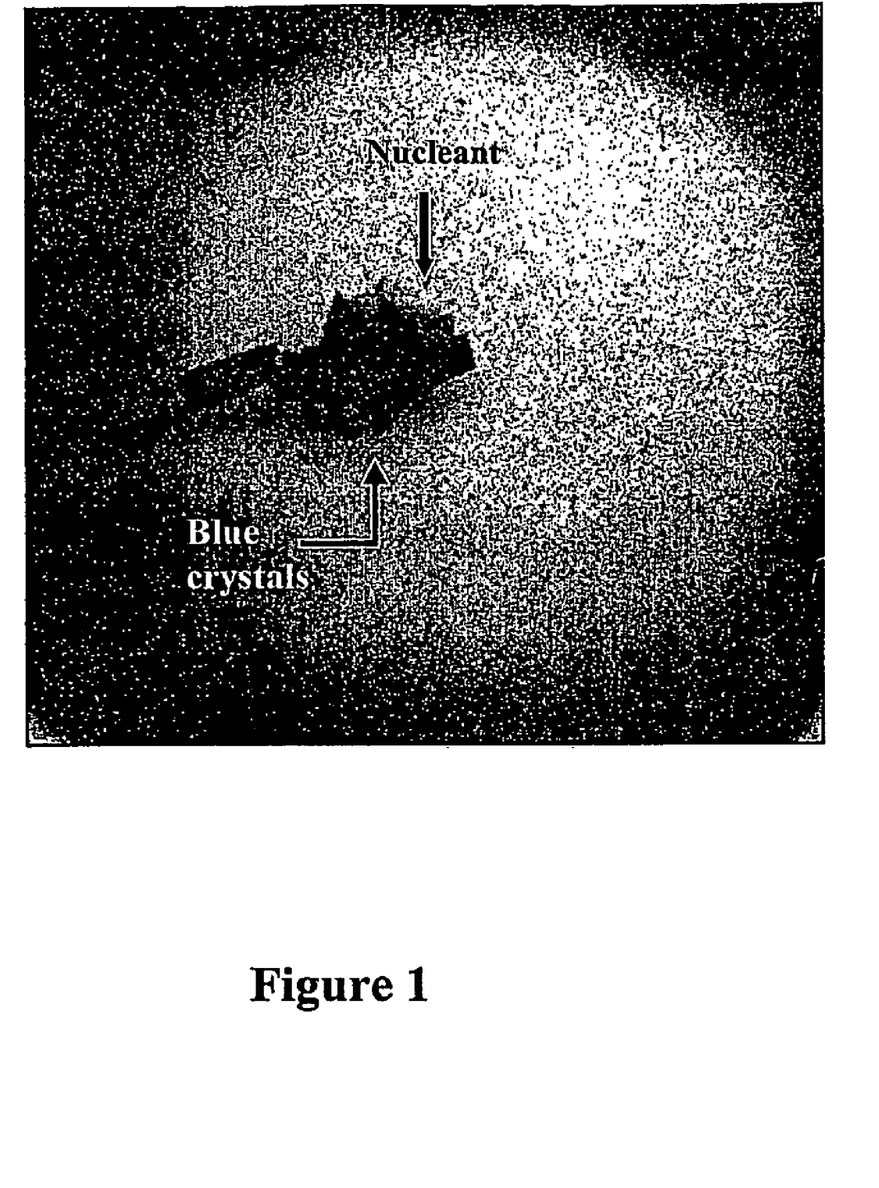
FIG. 1: Crystals of alpha crustacyanin (from lobster shell) grown on bioactive $CaO-P_2O_5-SiO_2$ gel-glass particles. The crystals measure approx 140×80×40 µm.

The drops containing the porous nucleant produced large single crystals after 2-3 days. FIG. 1.

The drops containing the (non porous) 45S5 bioactive glass remained clear as if no nucleant had been added.

The methods used were vapour diffusion and microbatch with in each case 2 µl drops. Trials were incubated at 10 and 4° C. Supersaturated conditions which gave rise to crystals overnight were:

20 mg/ml protein 15% PEG monomethyl ether 0.1 M MES buffer pH 6.5 and 10 mM Zinc chloride.

Metastable conditions into which the nucleants were inserted were:

20 mg/ml protein 12.5% PEG monomethyl ether 0.1M MES buffer pH 6.5 and 10 mM Zinc chloride.

Glass Characterisation Methods $N_2$ Adsorption

The gas adsorption was performed on a six-port Quantachrome AS6B-KR Autosorb gas sorption system using $N_2$ gas. The instrument determined isotherms volumetrically by a discontinuous static method at 77.K (Manual for Quantachrome $N_2$ Adsorption. Autosorb 6®, Quantachrome Corp. USA, 1997). $N_2$ with cross-sectional area of 0.162 $nm^2$ was used as the adsorptive gas (Lowell and Shields *Powder Surface Area and Porosity* 1984).

Further details are given in Example 2.

EXAMPLE 2

Measurement of Pore Characteristics $N_2$ Adsorption

The gas adsorption was performed on a six-port Quantachrome AS6B-KR Autosorb gas sorption system using $N_2$ gas. The instrument determined isotherms volumetrically by a discontinuous static method at 77.4K [1]. $N_2$ with molecule cross-sectional area of 0.162 $nm^2$ was used as the adsorptive gas [2].

Prior to $N_2$ sorption, all samples were degassed (i.e. exposing the monoliths to a vacuum pressure lower than 1 Pa at an elevated temperature) at 100° C. overnight (approx. 16-20 hours). This is done to remove physically adsorbed gases from the sample surfaces, in particular water vapour [2]. The specific surface areas were estimated in relation to the masses of the outgassed samples.

Each isotherm comprised a minimum of 20 adsorption and 20 desorption points measured at equilibrium. At least 4 adsorption points in the relative pressure range $0.05<P/P_0<0.30$ (where $P_0$ is the saturated vapour pressure) were used in the calculation of the BET surface area [3][4]. In each case, it was ensured that the slope and the intercept of the BET plots were positive and that the linear regression correlation coefficients were not less than 0.99991 [1]. Three isotherms were collected for each composition to ensure that the data was representative. Estimates of specific pore volume were obtained from the amount of nitrogen taken up by the sample in the relative pressure range $0.994<P/$ $P_0 < 0.999$ [1]. Pore size distributions were calculated from the desorption data using the BJH method [5].

Results—N$_2$ Adsorption

Isotherms

Figure 2:
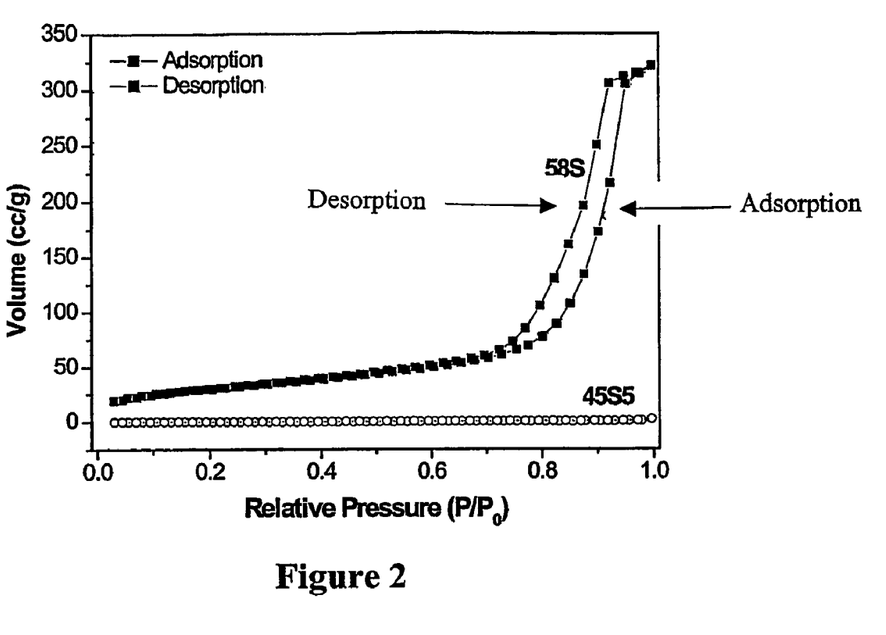
FIG. 2: $N_2$ sorption isotherms for 58S (mesoporous) and 45S5 (control) glass powders.

The isotherms shown in FIG. 2 are those obtained for 45S5 melt-derived glass and 58S sol-gel glass powders. The melt-derived glass displayed a very low adsorption, mainly monolayer formation followed by saturation, revealing negligible levels of porosity. In contrast, the isotherm for 58S sample corresponds to Type IV of the IUPAC classification indicating that the porous adsorbents possess pores in the radius range of 20 to 500 Å (diameter range of 4 to 100 nm) (i.e. the samples are mesoporous) [3]. Hysteresis in the multi layer region of the isotherm is associated with capillary condensation of N$_2$ during filling and emptying of mesopores in the structure. The hysteresis loop seen here is of type H1 [3]. This indicates that the materials tested contain open-ended cylindrical pores.

Figure 3:
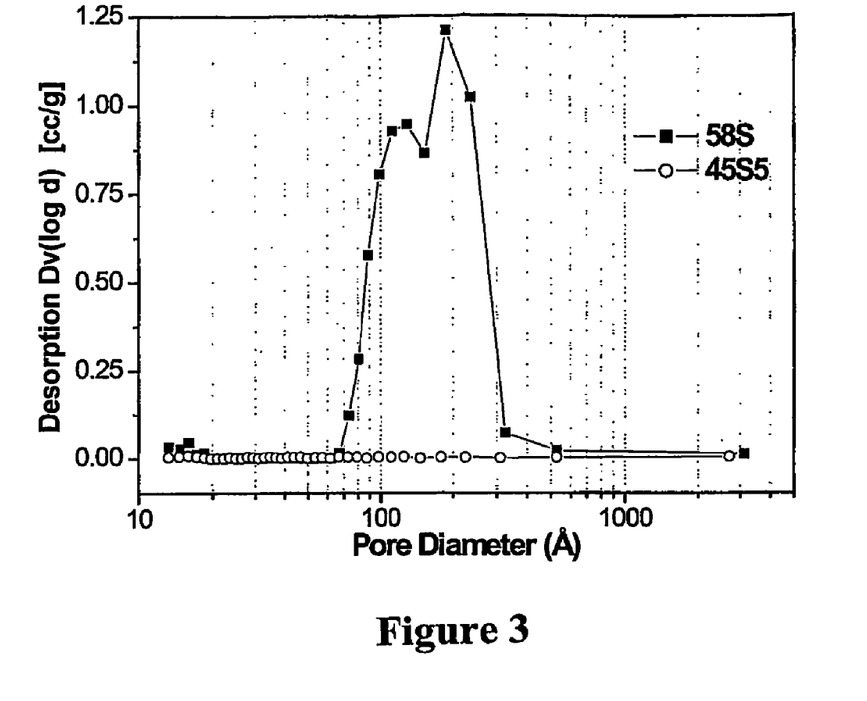
FIG. 3: Pore size distributions of 58S and 45S5 glasses.
Figure 4:
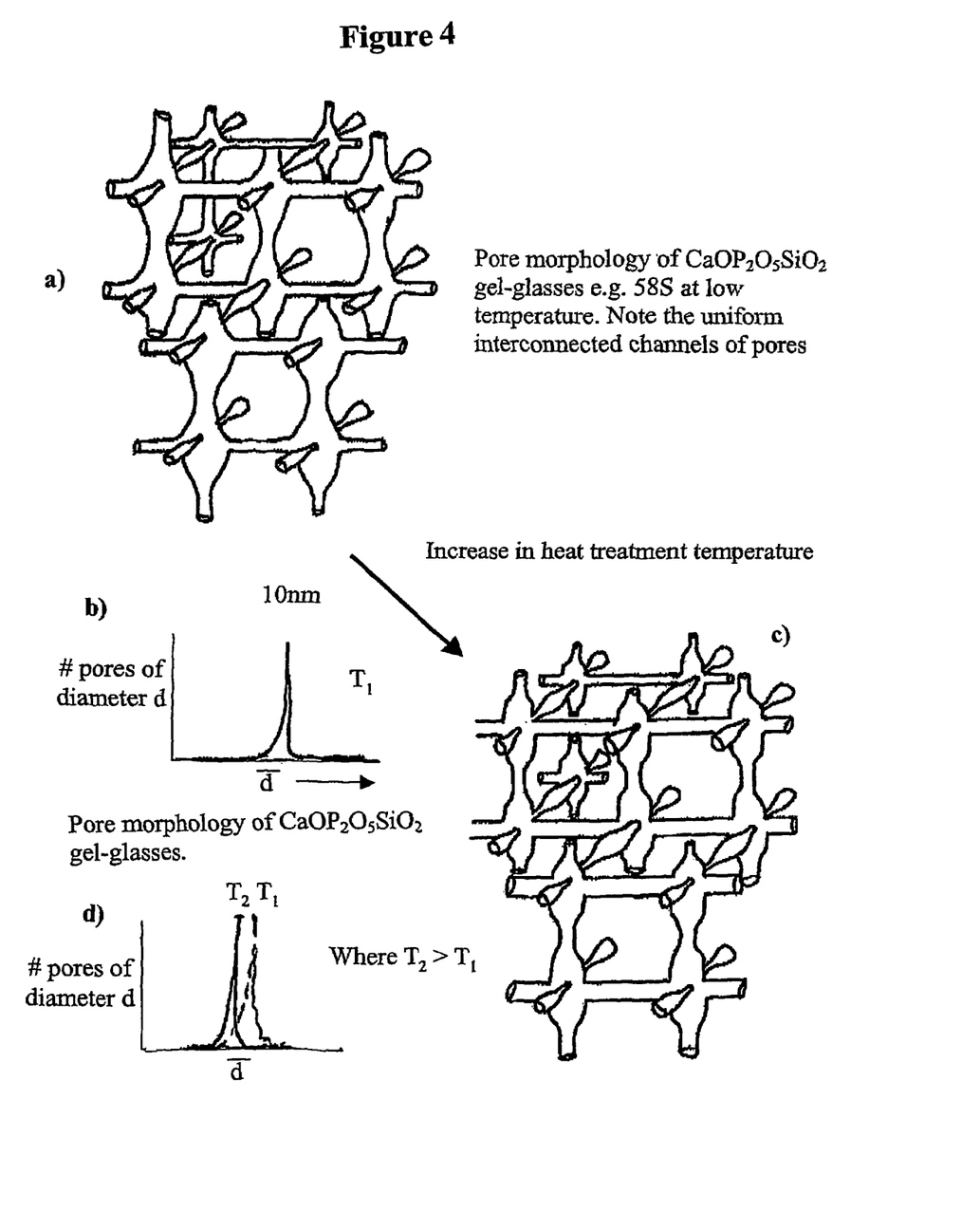
FIG. 4: Schematic diagram of a cross-section of a mesoporous glass (non-nucleant) that has a narrow pore size distribution.
Figure 5:
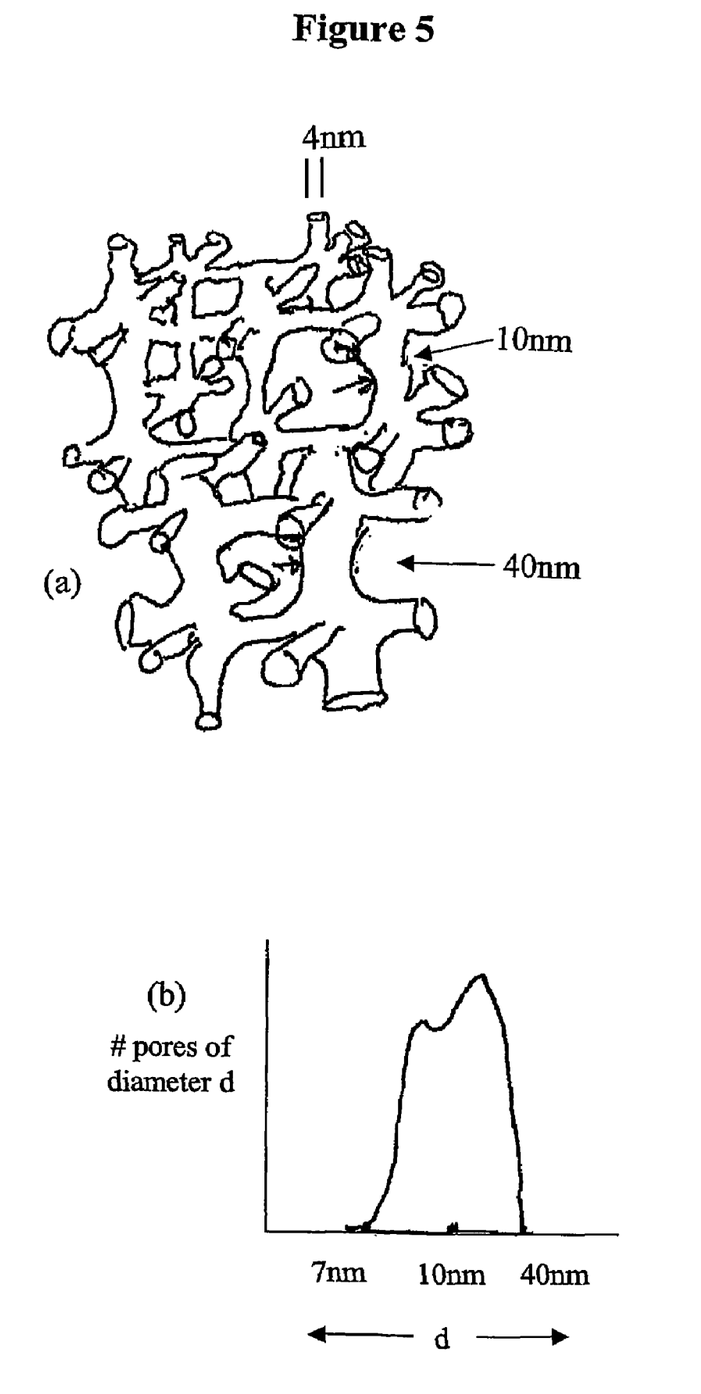
FIG. 5: Schematic diagram of a mesoporous glass nucleant with a broad distributino of pore diameters, from 7 to 40 nm.

The pore size distribution for the gel-glasses, calculated using the BJH model [5] on the desorption branch of the N$_2$ isotherm is depicted in FIG. 3.

Summary

|  | 58S | 45S5 |
| --- | --- | --- |
| Surface Area (m$^2$/g) | 110.7 | 0.86 |
| Pore Volume (cm$^3$g$^{-1}$) | 0.52 | n/a |
| Pore Diameter (Å) - mode | 112 | n/a |
| Pore Diameter (Å) - mean | 160 | n/a |

REFERENCES

[1]. Manual for Quantachrome N$_2$ Adsorption. Autosorb 6®, Quantachrome Corp. USA, 1997.

[2]. Lowell S, Shields J E. *Powder Surface Area and Porosity*. Chapman and Hall 1984.

[3]. Sing K S W, Everett D H, Haul R A W. *Pure and Appl. Chem.* 1985; 57: 603-619.

[4]. Brunauer S, Deming L S, Deming W E, Teller E. *J of Am. Chem. Soc.* 1940; 62: 1723-1732.

[5]. Barrett E P, Joyney L G, Halenda P P. *J of Am. Chem. Soc.* 1951; 73: 373-380

The invention claimed is:

1. A method of facilitating the crystallization of a macromolecule comprising adding a mesoporous glass as nucleant to a crystallization sample wherein the mesoporous glass comprises pores having diameters between 4 nm and 100 nm and has a surface area of at least 50 m$^2$/g.

2. A method as in claim 1 wherein a mesoporous glass is of a composition selected from the group consisting of SiO$_2$, CaO—P$_2$O$_5$—SiO$_2$ and Na$_2$O—CaO—P$_2$O$_5$—SiO$_2$ or combinations thereof.

3. A method as in claim 2 wherein a mesoporous glass comprises pores having diameters between 2 nm and 200 nm.

4. A method as in claim 3 wherein the diameter of the pores has a standard deviation of at least 10 nm.

5. A method as in claim 2 wherein crystallization of the macromolecule is induced at a lower critical level of super saturation than that obtained where the mesoporous glass is not added to the sample.

6. A method as in claim 1 wherein a mesoporous glass has interconnected pores that intersect with the surface of the glass.

7. A method as in claim 1 wherein crystallization of the macromolecule is induced at a lower critical level of super saturation than that obtained where the mesoporous glass is not added to the sample.

8. A method as in claim 1 further comprising preparing said mesoporous glass for use as a nucleant in crystallization by fracturing said material into pieces of submillimeter dimensions.

9. A method as in claim 8 wherein the pieces are no more than 200 micron in any dimension.

10. A method as in claim 1 further comprising:
(i) crystallizing said macromolecule in said sample in the presence of said mesoporous glass; and
(ii) analyzing the crystal structure of the crystal produced in (i).

11. A method as in claim 1 including adding said mesoporous glass to said crystallization sample using an automated dispensing system.

12. A method as in claim 11 wherein the mesoporous glass is added as a suspension in a liquid.

13. A method as in claim 1 wherein the macromolecule is a biological macromolecule.

14. A method of facilitating the crystallization of a macromolecule comprising:
(a) adding to a crystallization sample a mesoporous glass nucleant of a composition selected from the group consisting of SiO$_2$, CaO—P$_2$O$_5$—SiO$_2$ and Na$_2$O—CaO—P$_2$O$_5$—SiO$_2$ or combinations thereof;
(b) wherein each of the Ca, P, Si or Na atoms within the compositions may be substituted with a suitable atom chosen from the group consisting of B, Al, Ti, Mg, and K; and
(c) wherein, optionally, the composition may also include elements having an atomic number over 20 to enhance X-ray diffraction contrast.

15. A method as in claim 14 wherein a mesoporous glass is of a composition selected from the group consisting of SiO$_2$, CaO—P$_2$O$_5$—SiO$_2$ and Na$_2$O—CaO—P$_2$O$_5$—SiO$_2$ or combinations thereof.

16. A method as in claim 14 wherein a mesoporous glass comprises pores having diameters between 2 nm and 200 nm.

17. A method as in claim 14 wherein a mesoporous glass has interconnected pores that intersect with the surface of the glass.

18. A method as in claim 14 further comprising preparing said mesoporous glass for use as a nucleant in crystallization by fracturing said material into pieces of sub-millimeter dimensions.

19. A method as in claim 18 wherein the pieces are no more than 200 micron in any dimension.

20. A method as in claim 14 further comprising:
(i) crystallizing said macromolecule in said sample in the presence of a mesoporous glass; and
(ii) analyzing the crystal structure of the crystal produced in (i).

21. A method as in claim 14 including adding said mesoporous glass to said crystallization sample using an automated dispensing system.

22. A method as in claim 21 wherein the mesoporous glass is added as a suspension in a liquid.

23. A method as in claim 14 wherein the macromolecule is a biological macromolecule.

24. A crystal obtained by the method of claim 14.

25. A site suitable for crystallizing a macromolecule selected from the group consisting of a chamber, a fibre, film and a mesh, wherein said chamber, fibre, film or mesh comprises a mesoporous glass as defined in claim 14.

26. A site suitable for crystallizing a macromolecule as in claim 25 wherein the mesoporous glass forms a coating on the chamber, fibre, film or mesh.

27. A kit of parts comprising:
(a) a crystallization agent;
(b) a mesoporous glass nucleant of a composition selected from the group consisting of $SiO_2$, $CaO$—$P_2O_5$—$SiO_2$ and $Na_2O$—$CaO$—$P_2O_5$—$SiO_2$ or combinations thereof, wherein each of the Ca, P, Si or Na atoms within the compositions may be substituted with a suitable atom chosen from the group consisting of B, Al, Ti, Mg, and K; and wherein, optionally, the composition may also include elements having an atomic number over 20 to enhance X-ray diffraction contrast; and
(c) A site suitable for crystallizing a macromolecule selected from the group consisting of a chamber, a fibre, film and a mesh, wherein said chamber, fibre, film or mesh comprises said mesoporous glass.

* * * * *